US009318318B1

(12) United States Patent
Chan et al.

(10) Patent No.: US 9,318,318 B1
(45) Date of Patent: Apr. 19, 2016

(54) 3D ATOMIC LAYER GATE OR JUNCTION EXTENDER

(71) Applicant: International Business Machines Corporation, Armonk, NY (US)

(72) Inventors: Kevin K. Chan, Staten Island, NY (US); Pouya Hashemi, White Plains, NY (US); Effendi Leobandung, Stormville, NY (US); Dae-Gyu Park, Poughquaq, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/589,022

(22) Filed: Jan. 5, 2015

(51) Int. Cl.
| H01L 21/22 | (2006.01) |
| H01L 21/38 | (2006.01) |
| H01L 23/48 | (2006.01) |
| H01L 23/52 | (2006.01) |
| H01L 29/40 | (2006.01) |
| H01L 21/02 | (2006.01) |
| H01L 29/66 | (2006.01) |
| H01L 29/78 | (2006.01) |
| H01L 29/417 | (2006.01) |

(52) U.S. Cl.
CPC ...... *H01L 21/0228* (2013.01); *H01L 21/02694* (2013.01); *H01L 29/41783* (2013.01); *H01L 29/66553* (2013.01); *H01L 29/66795* (2013.01); *H01L 29/785* (2013.01)

(58) Field of Classification Search
CPC ............ H01L 21/2252; H01L 29/6659; H01L 21/0228; H01L 29/66553
USPC .......................................... 438/558; 257/773
See application file for complete search history.

(56) References Cited

U.S. PATENT DOCUMENTS

| 6,489,207 | B2 | 12/2002 | Furukawa et al. |
| 7,323,389 | B2 | 1/2008 | Goktepeli et al. |
| 7,687,383 | B2 | 3/2010 | Bauer |
| 8,394,710 | B2 | 3/2013 | Cheng et al. |
| 8,563,384 | B2 | 10/2013 | Ranade et al. |
| 2011/0169049 | A1 | 7/2011 | Loo et al. |
| 2012/0305893 | A1 | 12/2012 | Colinge |
| 2013/0040447 | A1 | 2/2013 | Swaminathan et al. |

OTHER PUBLICATIONS

Endo, et al., "Atomic Layer Deposition of 25-nm-thin Sidewall Spacer for Enhancement of FinFET Performance", 2011 Proceedings of the European Solid-State Device Research Conference (ESSDERC), 2011, pp. 83-86, © 2011 IEEE.
Hashemi, et al., "High-Performance Si 1-x Ge x Channel on Insulator Trigate PFETs Featuring an Implant-Free Process and Aggressively-Scaled Fin and Gate Dimensions", 2013 Symposium on VLSI Technology Digest of Technical Papers, pp. T18-T19.
Yamashita, et. al., "Sub-25nm FinFET with Advanced Fin Formation and Short Channel Effect Engineering", 2011 Symposium on VLSI Technology Digest of Technical Papers, pp. 14-15.
Zschatzsch, et al., "High Performance n-MOS finFET by Damage-Free, Conformal Extension Doping", 2011 IEEE International Electron Devices Meeting (IEDM), pp. 35.6.1-35.6.4., © 2011 IEEE.

*Primary Examiner* — David S Blum
(74) *Attorney, Agent, or Firm* — Steven F. McDaniel

(57) ABSTRACT

A method for fabricating a semiconductor device includes receiving a gated finned substrate comprising an isolation layer with a semiconductor fin formed thereon and a gate formed over the semiconductor fin, depositing an atomic layer of dopant on a portion of the semiconductor fin that is laterally adjacent to the gate, forming a lateral spacer on a sidewall of the gate and above a gate extension portion of the atomic layer of dopant, and epitaxially growing a raised source or drain region on the semiconductor fin, that is laterally adjacent to the lateral spacer, from the atomic layer of dopant. The method may also include conducting a low temperature annealing process to diffuse the atomic layer of dopant to the raised source or drain region of the semiconductor fin. A corresponding apparatus is also disclosed herein.

20 Claims, 6 Drawing Sheets

3D ATOMIC LAYER GATE OR JUNCTION EXTENDER

BACKGROUND OF THE INVENTION

The present invention relates generally to semiconductor devices and device fabrication and more particularly to non-planar semiconductor devices and device fabrication.

One of the challenges in scaling transistors to increasingly smaller geometries is controlling leakage current while increasing drive current. Fully depleted devices such as ETSOI, tri-gate, and finfet devices offer the promise of excellent control of short channel effects (e.g., barrier lowering, punch-through, surface scattering, velocity saturation, impact ionization, and hot electrons). However, fully depleted devices suffer from high extension region resistance that degrades device performance.

One of the factors in high extension region resistance is traditional ion implantation that is used to dope selected regions of semiconductor devices. The bombardment of ions during traditional ion implantation destroys much of the crystalline structure resulting in many non-crystalline (amorphous) regions. Unlike planar structures, which do not have surface discontinuities, the discontinuities of non-planar devices impede re-crystallization from intact crystalline regions (also known as seeds) during high temperature annealing. As a result, non-planar devices have higher resistivity than planar devices. Furthermore, traditional ion implantation leaves the extension region of a device (e.g., the area below the lateral spacers of the gate) undoped, resulting in even higher device resistance.

SUMMARY

A semiconductor device (i.e., apparatus) and a method for fabricating the semiconductor device are disclosed herein. In one embodiment, a method for fabricating a semiconductor device includes receiving a gated finned substrate comprising an isolation layer with a semiconductor fin formed thereon and a gate formed over the semiconductor fin, depositing an atomic layer of dopant on a portion of the semiconductor fin that is laterally adjacent to the gate, forming a lateral spacer on a sidewall of the gate and above a gate extension portion of the atomic layer of dopant, and epitaxially growing a raised source or drain region on the semiconductor fin, that is laterally adjacent to the lateral spacer, from the atomic layer of dopant. The method may also include conducting a low temperature annealing process to diffuse the atomic layer of dopant to the raised source or drain region as well as a channel edge region of the semiconductor fin.

In one embodiment, the apparatus includes a gated finned substrate comprising an isolation layer with a semiconductor fin formed thereon and a gate formed over the semiconductor fin, an atomic layer of dopant formed on a portion of the semiconductor fin that is laterally adjacent to the gate, a lateral spacer formed on a sidewall of the gate and above a gate extension portion of the atomic layer of dopant, and a raised source or drain region formed on the semiconductor fin over the atomic layer of dopant laterally adjacent to the lateral spacer. In some embodiments, the semiconductor fin comprises silicon (and no germanium) and the raised source or drain comprises at least 50% germanium.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

DETAILED DESCRIPTION

The embodiments disclosed herein effectively eliminate the need for high temperature annealing, enable doping of the extension regions of semiconductor devices (e.g., for a gate or junction), and reduce device resistance.

Figure 1:
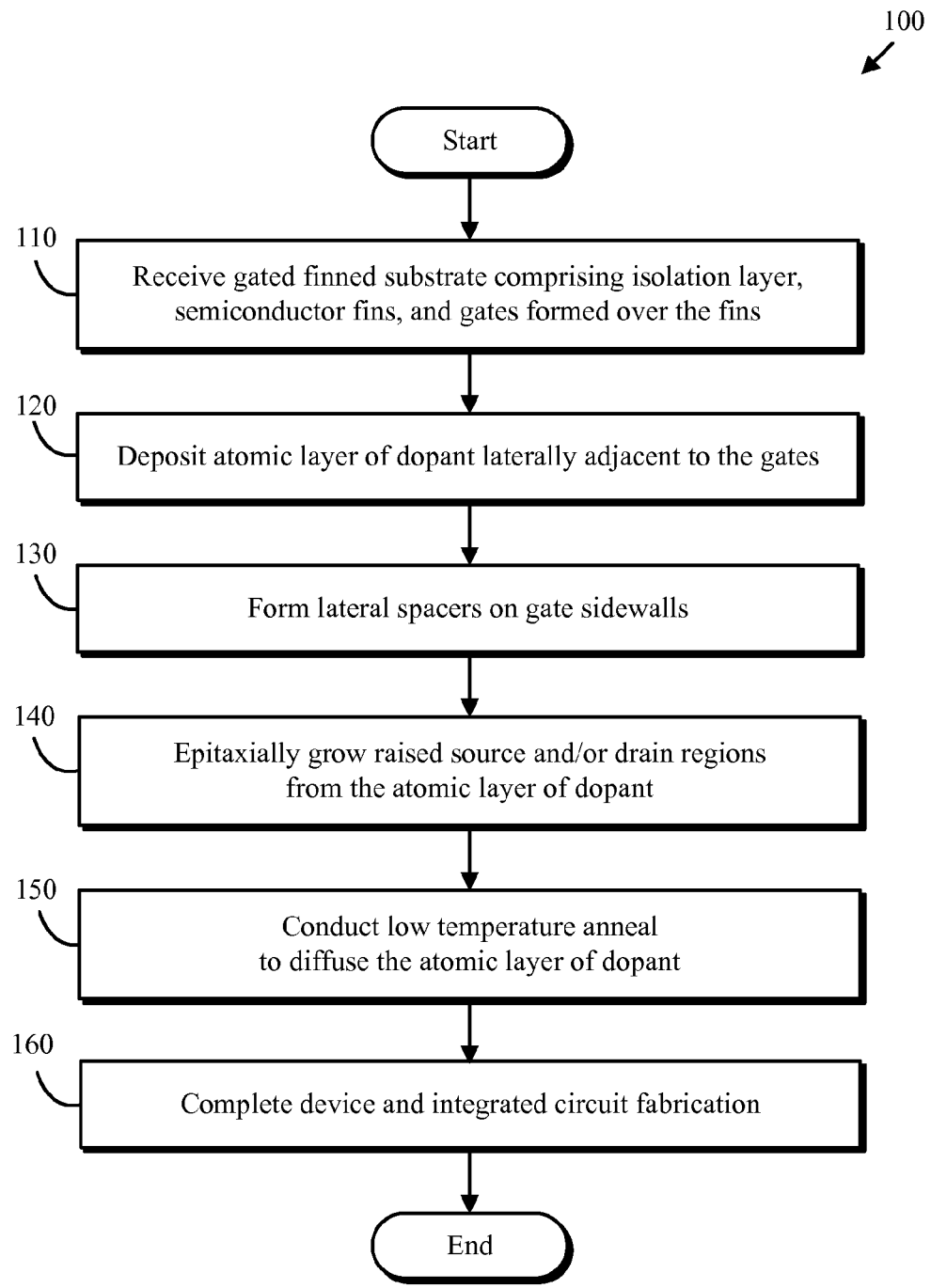
FIG. 1 is a flowchart depicting one embodiment of a method for fabricating a semiconductor device.

For example, FIG. 1 is a flowchart depicting one embodiment of a method 100 for fabricating a semiconductor device. As depicted, the method 100 includes receiving (110) a gated finned substrate, depositing (120) an atomic layer of dopant, forming (130) lateral spacers, epitaxially growing (140) raised source and/or drain regions, conducting (150) a low temperature annealing process, and completing (160) device and integrated circuit fabrication. The method 100 may be used to fabricate semiconductor devices with reduced channel resistance.

Receiving (110) a gated finned substrate may include receiving a substrate with an isolation layer and semiconductor fins formed on the surface. The substrate may be a semiconductor-on-insulator (SOI) substrate where the semiconductor layer is patterned with fins. One or more gates may be formed over the patterned fins. Each gate may cover a top, a left sidewall, and a right sidewall of one or more fins. For example, a single gate may extend across two or more parallel fins and contact the tops and sidewalls of those fins. See, for example, FIGS. 4A-4C.

Depositing (120) an atomic layer of dopant may include depositing an atomic layer of dopant on a portion of the semiconductor fins that is laterally adjacent to the gates formed over the semiconductor fins. The atomic layer of dopant may be placed laterally (and immediately) adjacent to the gates and provide an extension region for the gates. See, for example, FIGS. 5A-5C.

Forming (130) lateral spacers may include forming lateral spacers on the sidewalls of the gates that are above the gate extension regions of the atomic layer of dopant. Consequently, the lateral spacers may cover the regions of the atomic layer of dopant (and thereby the semiconductor fins) that are most immediately adjacent to the gates. See, for example, FIGS. 6A-6C.

Epitaxially growing (140) raised source and/or drain regions may include epitaxially growing, from the atomic layer of dopant, raised source and/or drain regions on the semiconductor fin. For example, the raised source and/or drain regions may be formed by epitaxially growing a semiconductor material directly on the atomic layer of dopant. The raised source and/or drain regions may be laterally adjacent to the lateral spacers. See, for example, FIGS. 7A-7C.

Conducting (150) a low temperature annealing process may include annealing the substrate to enable diffusion of the atomic layer of dopant into the extension regions of the fins (e.g., under the lateral spacer). Diffusion of the dopant (across the interface) into the extension regions of the fins may lower the resistance of the resulting semiconductor devices.

Completing (160) device and integrated circuit fabrication may include conducting additional fabrication steps to create a complete integrated circuit including packaging of the integrated circuit.

Figure 2:
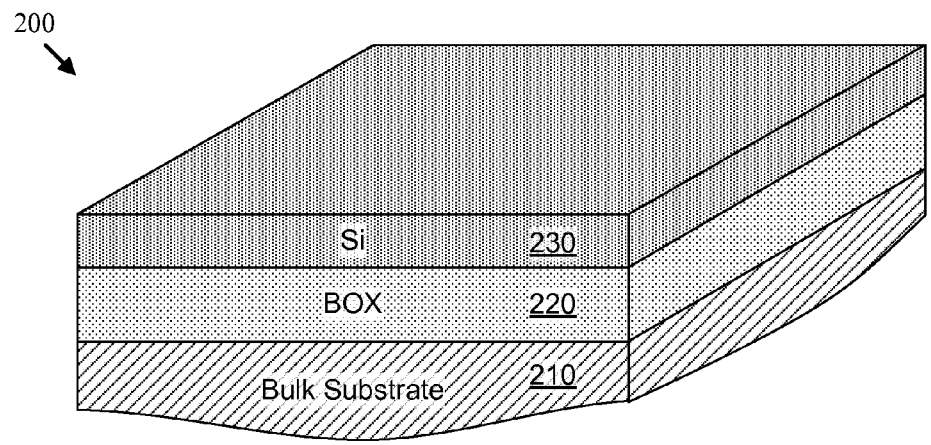
FIG. 2 is a perspective view illustration of a semiconductor-on-insulator (SOI) substrate.

FIG. 2 is a perspective view illustration of a semiconductor-on-insulator (SOI) substrate 200. As depicted, the SOI substrate 200 includes a bulk substrate layer 210, an insulating layer 220, and a semiconductor layer 230. In the embodiment depicted in FIG. 2, and in embodiments shown in subsequent figures, the semiconductor layer 230 is silicon. The SOI substrate 200 may be commercially available, or may be fabricated through processes known to those skilled in the art. For example, the SOI substrate 200 may be fabricated by processing bulk silicon wafers using the SIMOX process, or the like. In one embodiment, an oxygen ion beam is used to implant oxygen molecules into the bulk substrate which is subsequently annealed to form an insulating (e.g., buried oxide or BOX) layer 220 of silicon dioxide that is sandwiched between the silicon bulk substrate layer 210 and a silicon semiconductor layer 230.

FIGS. 3 through 7 are perspective view, front view, and side view illustrations of the SOI substrate at various stages of processing for one embodiment of the method of FIG. 1. With each illustration, the Figure number (i.e., 3 through 7) is appended with the letter A, B, or C for the perspective view, front view, and side views of the SOI substrate, respectively. For simplicity, the bulk substrate layer 210 of the SOI substrate 200 is omitted from FIGS. 3 through 7.

Figure 3A:
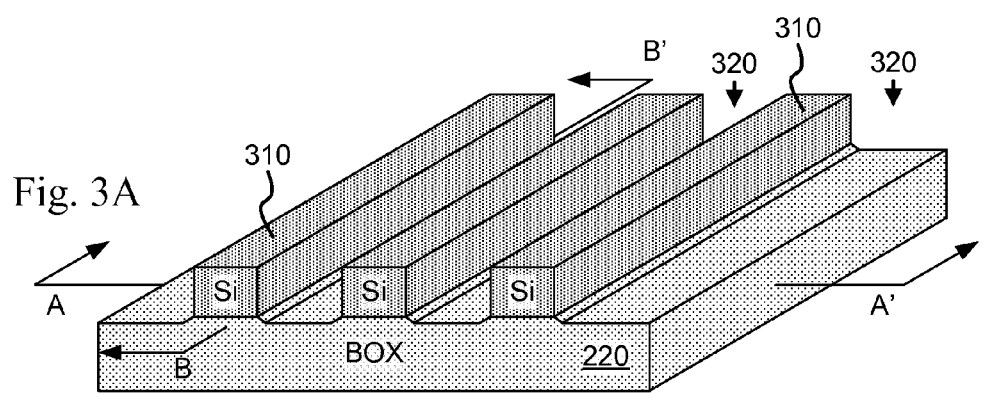
FIGS. 3A, 3B, and 3C are perspective view, front view and side view illustrations of the SOT substrate at a particular stage of processing for one embodiment of the method of FIG. 1.
Figure 3B:
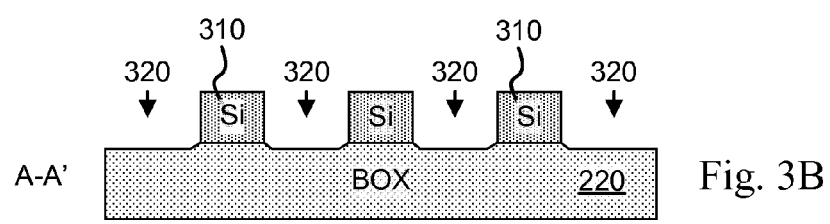
Figure 3C:
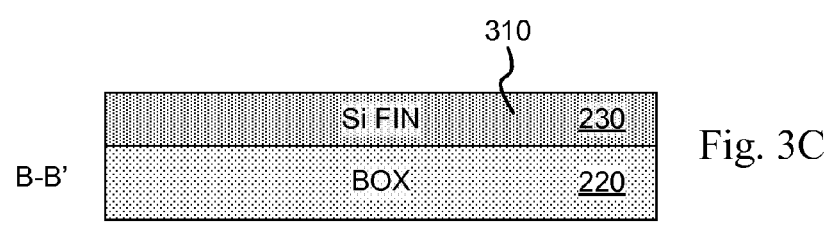

FIGS. 3A-3C show that semiconductor fins 310 may be formed on the SOI substrate 200. For example, a reactive ion (directional) etch process may be used to etch trenches 320 that form (i.e., define) the semiconductor fins 310 from the semiconductor layer 230. Consequently, the semiconductor fins 310 may comprise the same material as the semiconductor layer 230. In the depicted embodiments, the semiconductor fins 310 comprise silicon.

Figure 4A:
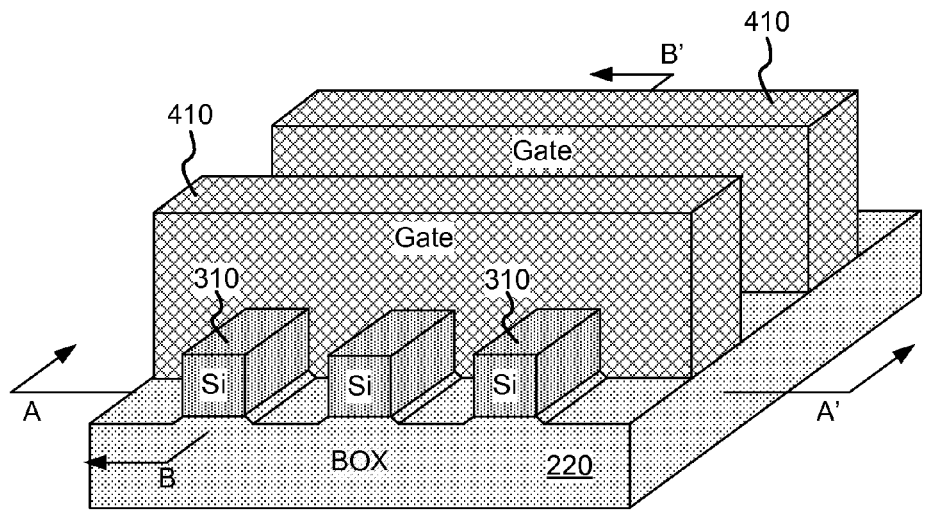
FIGS. 4A, 4B, and 4C are perspective view, front view and side view illustrations of the SOT substrate at a particular stage of processing for one embodiment of the method of FIG. 1.
Figure 4B:
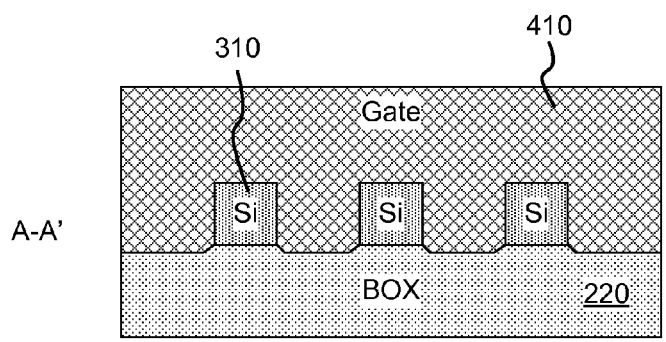
Figure 4C:
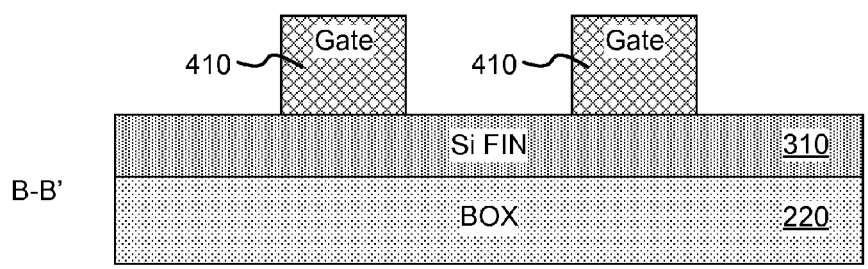

FIGS. 4A-4C show that one or more gates 410 may be formed over the semiconductor fins. The gates 410 may be fabricated according to methods known by those skilled in the art. For example, the gate 410 may be fabricated by depositing and patterning one or more gate materials. In certain embodiments, a semiconductor layer (crystalline, polycrystalline, or amorphous) and a metal layer (e.g., a high-k metal) are deposited and patterned to form one or more gates 410.

Figure 5A:
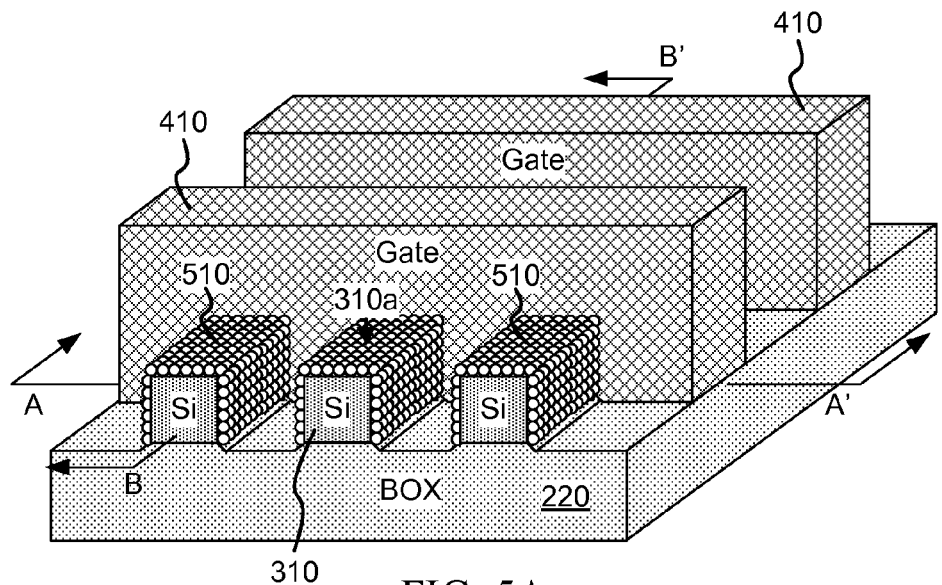
FIGS. 5A, 5B, and 5C are perspective view, front view and side view illustrations of the SOT substrate at a particular stage of processing for one embodiment of the method of FIG. 1.
Figure 5B:
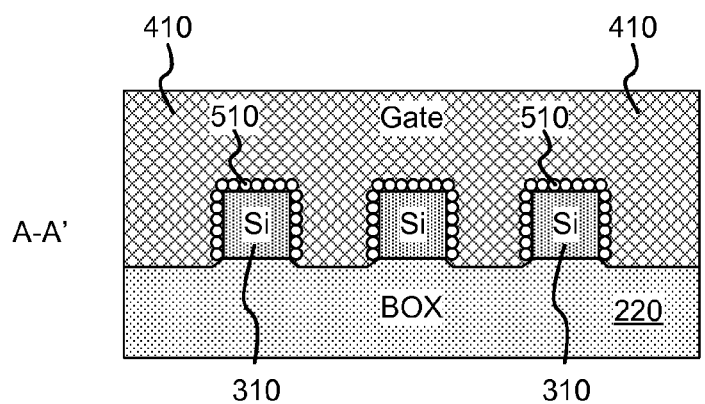
Figure 5C:
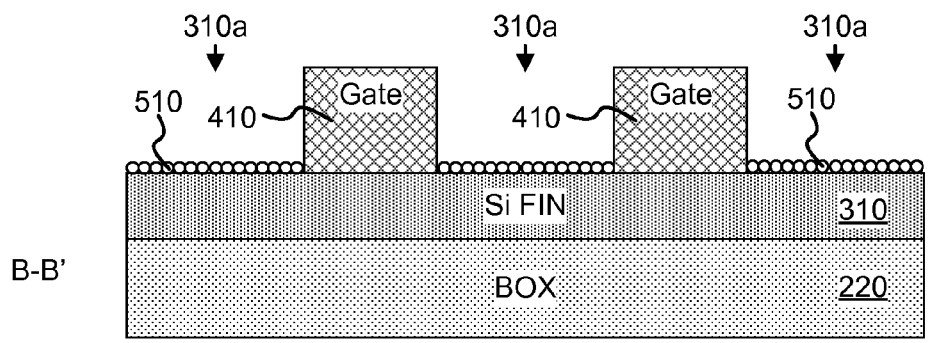

FIGS. 5A-5C show that an atomic layer of dopant 510 may be deposited on a portion 310a of the semiconductor fins 310 that is laterally adjacent to the gates 410 formed over the fins 310. The atomic layer of dopant 510 may be placed laterally (and immediately) adjacent to the gates 410 and provide an extension region for the gates. Consequently, the atomic layer of dopant may cover areas that are immediately adjacent to the top, left sidewall and right sidewall regions covered by the gates.

In some embodiments, the atomic layer of dopant 510 is deposited on the semiconductor fins 310 via atomic layer deposition. The atomic layer of dopant 510 may be sufficiently thin to avoid lattice mismatch issues with materials above and below the layer 510. For example, the thickness of the atomic layer of dopant may be less than 2 nm. In some embodiments, the thickness of the atomic layer of dopant is substantially less than 2 nm (e.g. <1 nm). The atomic layer of dopant may, or may not be, contiguous. For example, the method of deposition may result in atomic layer dopant regions that are intentionally, or unintentionally, fragmented.

The dopant material used for the atomic layer of dopant may be selected to correspond to a device type. For example, boron may be deposited for p-type devices and phosphorus for n-type devices. Other possible dopant materials include arsenic, tin, antimony, and aluminum. Combinations of dopants may also be used for the dopant material. Using an extremely high activated concentration for the dopant material may reduce the resistance of the extension region of the resulting devices and improve device performance. For example, in one embodiment an activated boron dopant concentration of $7 \times 10^{20}$ atoms per cm^3 resulted in a sheet resistance (Rs) of approximately 2500 ohms/sq for a dopant layer of ~2 nm in thickness.

Figure 6A:
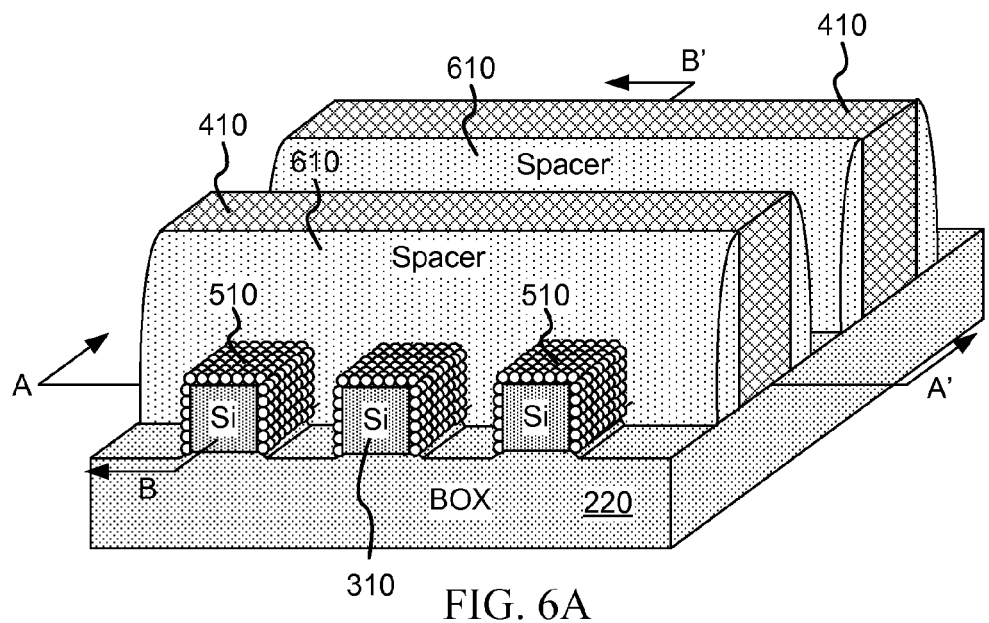
FIGS. 6A, 6B, and 6C are perspective view, front view and side view illustrations of the SOT substrate at a particular stage of processing for one embodiment of the method of FIG. 1.
Figure 6B:
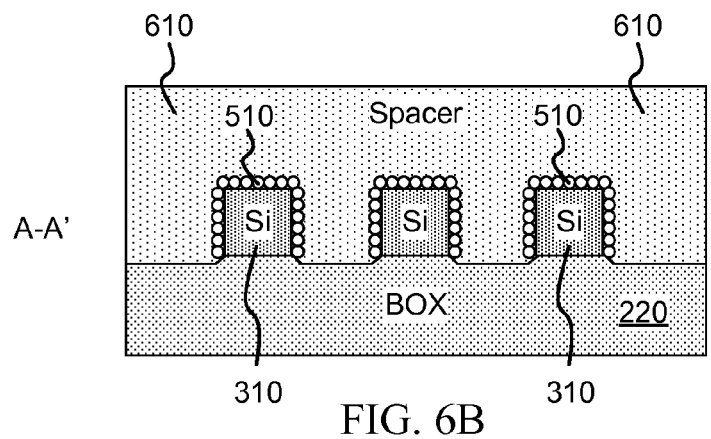
Figure 6C:
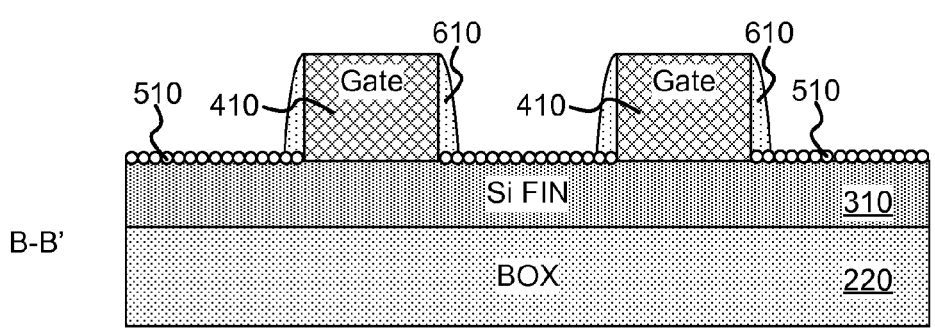

FIGS. 6A-6C show that lateral spacers 610 may be formed on the sidewalls of the gates that are above the gate extension regions of the atomic layer of dopant. The lateral spacers 610 may cover the regions of the atomic layer of dopant (and thereby the semiconductor fins) that are most immediately adjacent to the gates. In some embodiments, the lateral spacers 610 are formed by a sidewall image transfer method.

The lateral spacers provide electrical isolation between the gate and the raised source and/or drain regions formed on either side of the gate. Consequently, the thickness of the lateral spacer may be dependent on the material used and the threshold voltages of the resulting devices. The material used to form the lateral spacer 610 may be an oxide such as silicon dioxide or nitride such as silicon nitride. In certain embodiments, the thickness of the lateral spacer is less than 2 nm.

In certain embodiments, the lateral spacers are sufficiently thin that the atomic layer of dopant 510 can be applied after formation of the lateral spacers 610. For example, the lateral spacers 610 may be thin enough that a low temperature anneal may cause an atomic layer of dopant that is completely outside of the lateral spacers 610 to *diffuse* under the lateral spacers far enough to provide electrical connectivity to the gate 410.

Figure 7A:
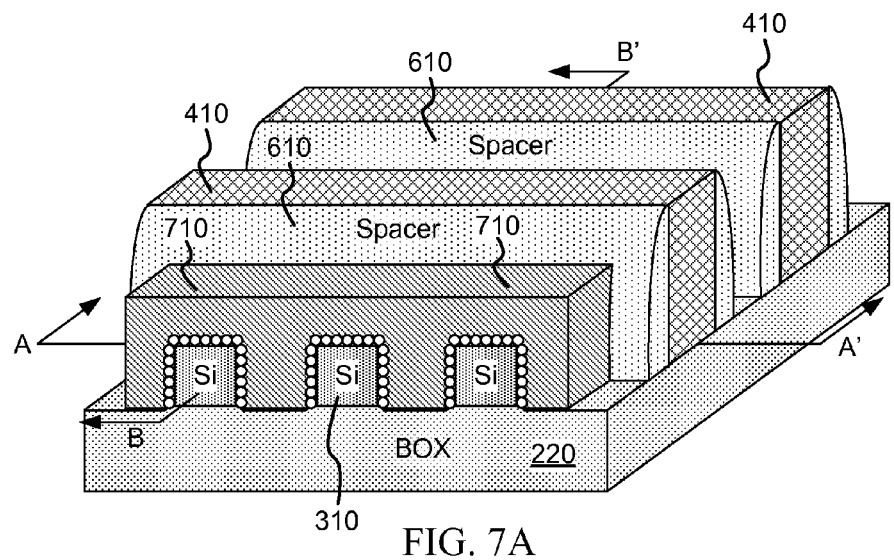
FIGS. 7A, 7B, and 7C are perspective view, front view and side view illustrations of the SOT substrate at a particular stage of processing for one embodiment of the method of FIG. 1.
Figure 7B:
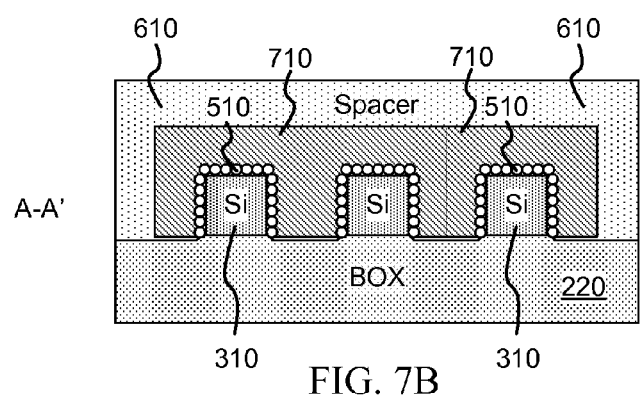
Figure 7C:
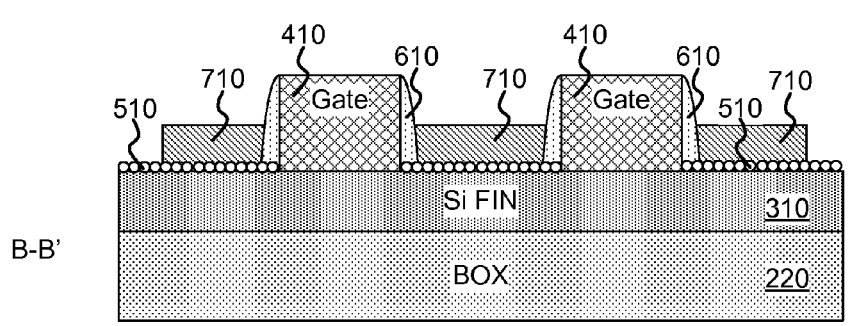

FIGS. 7A-7C show that raised source and/or drain regions 710 may be formed that are laterally adjacent to the lateral spacers 610. For example, the raised source and/or drain regions may be formed by epitaxially growing a semiconductor material from the atomic layer of dopant. The semiconductor material may be grown to extend laterally from the outer edge of the lateral spacers that reside on the sidewalls of the gate.

The semiconductor material of the raised source and/or drain regions may differ from the material of the semiconductor fin. For example, in some embodiments the semiconductor fins are silicon (with no germanium) and the raised source and drain regions are primarily (or completely) germanium. Using a different material for the raised source and drain regions than the semiconductor fins may provide additional strain to the source and drain, increase the mobility of holes and/or electrons, and decrease the resistance of the resulting semiconductor devices.

In some embodiments, epitaxial growth of the raised source and/or drain regions does not include in-situ doping. In other embodiments, in-situ doping is used during epitaxial growth of the raised source and/or drain regions in order to infuse the raised source and/or drain regions with a dopant. For example, a p-type dopant may be used for p-type source and/or drain regions and an n-type dopant may be used for n-type source and/or drain regions. The p-type and n-type regions may be epitaxially grown during separate phases of fabrication. For example, n-type epitaxial growth may be conducted while the p-type regions are masked off, and p-type epitaxial growth may be conducted while the n-type regions are masked off. The dopant type for the raised source and/or drain regions may correspond to a dopant type of the underlying atomic layer of dopant.

Subsequent to forming the raised source and/or drain regions, the substrate 200 and the devices formed thereon may undergo low temperature annealing. For example, the annealing temperature may be approximately 600 degrees Celsius. The low temperature annealing may be sufficient to diffuse the dopant of the atomic layer of dopant into the source and/or drain regions. Diffusing the dopant of the atomic layer of dopant into the source and/or drain regions may provide better electrical connectivity, and eliminate undoped extension regions. The resulting doped extension regions may be present on the sidewalls and tops of the semiconductor fins. Consequently, the extension regions may be three-dimensional and not planar.

In addition to the steps and operations disclosed herein, additional steps and operations may be performed while retaining the spirit and intent of the disclosed embodiments. Also, it should be noted that the apparatuses disclosed herein may be integrated with additional circuitry within integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for fabricating a semiconductor device, the method comprising:
   receiving a gated finned substrate comprising an isolation layer with a semiconductor fin formed thereon and a gate formed over the semiconductor fin;
   depositing an atomic layer of dopant, consisting of a dopant material, on a portion of the semiconductor fin that is laterally adjacent to the gate;
   forming a lateral spacer on a sidewall of the gate and above a gate extension portion of the atomic layer of dopant; and
   epitaxially growing a raised source or drain region on the semiconductor fin, that is laterally adjacent to the lateral spacer, from the atomic layer of dopant.

2. The method of claim 1, wherein depositing the atomic layer of dopant comprises masking off the gate and conducting an atomic layer deposition process.

3. The method of claim 1, further comprising conducting a low temperature annealing process of less than 800 degrees Celsius to *diffuse* the atomic layer of dopant to the raised source or drain region of the semiconductor fin.

4. The method of claim 1, wherein the atomic layer of dopant comprises at least one of arsenic, phosphorus, boron, tin, antimony, and aluminum.

5. The method of claim 1, wherein epitaxially growing the raised source or drain region on the semiconductor fin comprises in-situ doping.

6. The method of claim 1, wherein a dopant type for the raised source or drain region corresponds to a dopant type of the atomic layer of dopant.

7. The method of claim 1, wherein the gate comprises a semiconductor layer and a high-K metal layer.

8. The method of claim 1, wherein the gate covers a top, a left sidewall and a right sidewall of the semiconductor fin.

9. The method of claim 1, wherein the semiconductor fin comprises silicon and no germanium.

10. The method of claim 9, wherein the raised source or drain region comprises germanium.

11. An apparatus comprising:
- a gated finned substrate comprising an isolation layer with a semiconductor fin formed thereon and a gate formed over the semiconductor fin;
- an atomic layer of dopant, consisting of a dopant material, formed on a portion of the semiconductor fin that is laterally adjacent to the gate;
- a lateral spacer formed on a sidewall of the gate and above a gate extension portion of the atomic layer of dopant; and
- a raised source or drain region formed on the semiconductor fin over the atomic layer of dopant laterally adjacent to the lateral spacer.

12. The apparatus of claim 11, wherein the atomic layer of dopant was formed by atomic layer deposition.

13. The apparatus of claim 11, wherein the atomic layer of dopant comprises at least one of arsenic, phosphorus, boron, tin, antimony, and aluminum.

14. The apparatus of claim 11, wherein epitaxially growing the raised source or drain region on the semiconductor fin comprises in-situ doping.

15. The apparatus of claim 11, wherein a dopant type for the raised source or drain corresponds to a dopant type of the atomic layer of dopant.

16. The apparatus of claim 11, wherein the gate comprises a semiconductor layer and a high-K metal layer.

17. The apparatus of claim 11, wherein the gate covers a top, a left sidewall and a right sidewall of the semiconductor fin.

18. The apparatus of claim 11, wherein the semiconductor fin comprises silicon and no germanium.

19. The apparatus of claim 11, wherein the raised source or drain region comprises germanium.

20. A method for fabricating a semiconductor device, the method comprising:
- receiving a gated finned substrate comprising an isolation layer with semiconductor fins formed thereon and gates formed over the semiconductor fins;
- masking off the gates and n-type regions of the semiconductor fins that are laterally adjacent to the gates and depositing, via atomic layer deposition, a p-type atomic layer of dopant on p-type regions of the semiconductor fins that are laterally adjacent to the gates;
- masking off the gates and p-type regions of the semiconductor fins that are laterally adjacent to the gates and depositing, via atomic layer deposition, an n-type atomic layer of dopant on n-type regions of the semiconductor fins that are laterally adjacent to the gates;
- forming lateral spacers on sidewalls of the gates and above gate extension regions of the atomic layer of dopant; and
- epitaxially growing, from the atomic layer of dopant, raised source and drain regions on the n-type regions and the p-type regions of the semiconductor fins.

\* \* \* \* \*